(12) United States Patent
Egami

(10) Patent No.: US 8,130,333 B2
(45) Date of Patent: Mar. 6, 2012

(54) ELECTRIC OPTICAL DEVICE AND ELECTRONIC DEVICE

(75) Inventor: Takafumi Egami, Chitose (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/040,389

(22) Filed: Mar. 4, 2011

(65) Prior Publication Data

US 2011/0215337 A1   Sep. 8, 2011

(30) Foreign Application Priority Data

Mar. 8, 2010  (JP) ................. 2010-050233

(51) Int. Cl.
 *G02F 1/133*  (2006.01)
(52) U.S. Cl. ............... 349/33; 349/19; 349/41; 349/42; 349/46; 349/47
(58) Field of Classification Search .......... 349/19, 349/33, 41, 42, 46, 47
See application file for complete search history.

(56) References Cited

U.S. PATENT DOCUMENTS 7,180,108 B2 *  2/2007  Kawase et al. ............... 257/288
(Continued)

FOREIGN PATENT DOCUMENTS

JP   2007-142320 A   6/2007
JP   2008-077030 A   4/2008

*Primary Examiner* — Jennifer Doan
(74) *Attorney, Agent, or Firm* — Lowe Hauptman Ham & Berner, LLP

(57) ABSTRACT

An electric optical device includes a transistor that includes a semiconductor layer having a source region connected to a data line, a drain region connected to a pixel electrode, and a channel region, and a gate electrode, a first light blocking film that is formed to be wider than the gate electrode and that is connected to the gate electrode via a first contact hole which is opened in a first insulating film disposed on the gate electrode, and a second light blocking film that is provided between the semiconductor layer and a substrate and is connected to the first light blocking film via a second contact hole which is opened to penetrate the first insulating film, a gate insulating film, and a second insulating film.

7 Claims, 7 Drawing Sheets

U.S. PATENT DOCUMENTS 7,619,699 B2 * 11/2009 Ishii .............................. 349/44
2007/0117239 A1 5/2007 Ishi
2008/0048190 A1 2/2008 Ishii

* cited by examiner

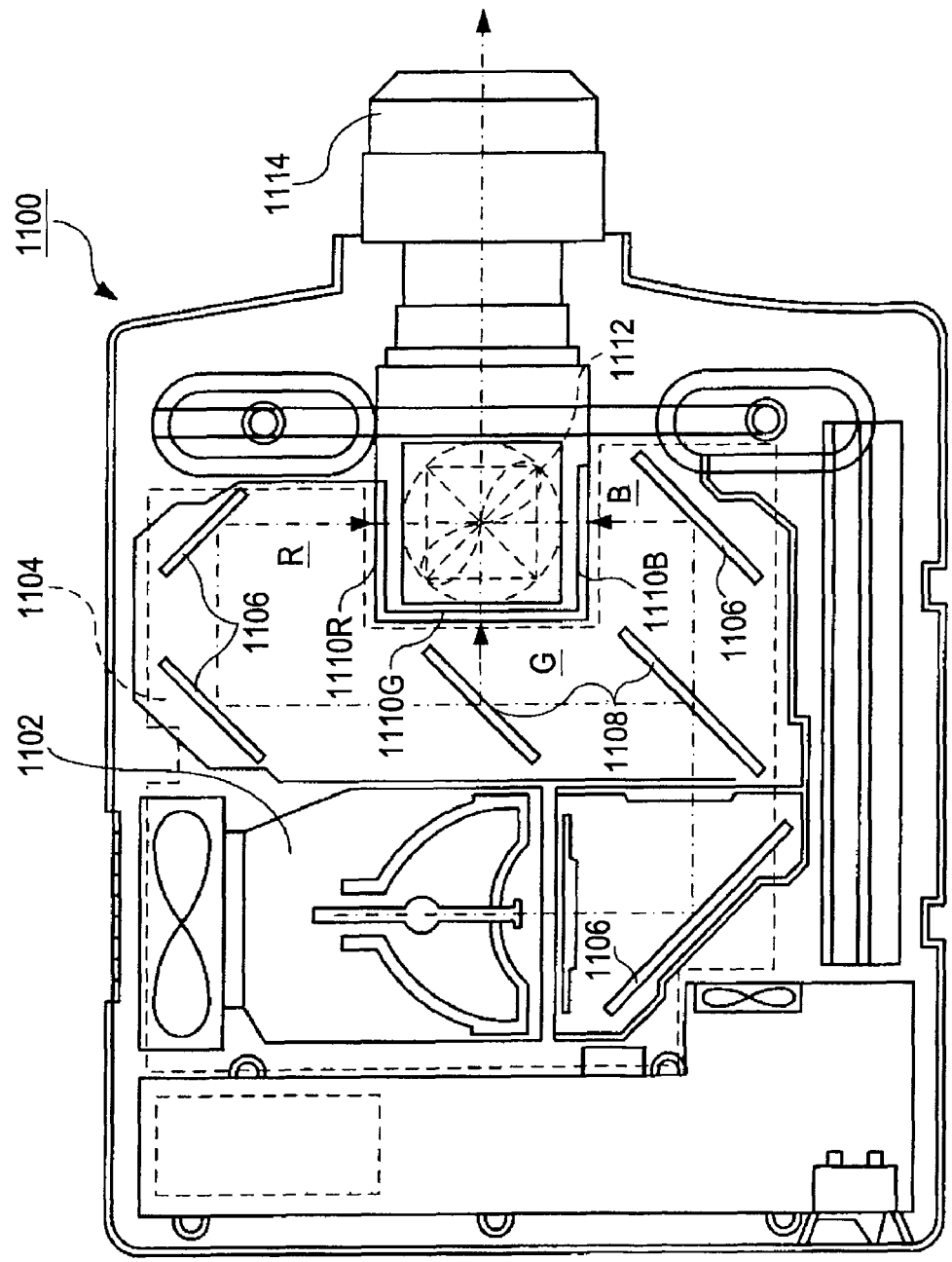

ELECTRIC OPTICAL DEVICE AND ELECTRONIC DEVICE

BACKGROUND

1. Technical Field

The present invention relates to an electric optical device such as, for example, a liquid crystal display, a manufacturing method thereof, and an electronic device including the electric optical device, for example, such as a liquid crystal projector.

2. Related Art

A liquid crystal display which is an example of electric optical devices may be used as a light modulation unit (that is, a light valve) of, for example, a projection type display device. Strong light is incident to the light valve from a light source, and, at this time, if a semiconductor layer forming a TFT (thin film transistor) in the light valve is irradiated with the light, this results in a light leakage current, which causes flickering or pixel unevenness to occur in a display image. In order to prevent this, a light blocking film may be provided in a laminated structure as a light blocking mechanism for blocking the incident light.

Here, the TFT may be formed in a self-aligning manner by implanting an impurity into the semiconductor layer using a gate electrode as a mask during the manufacturing thereof. For example, JP-A-2008-77030 discloses a technique in which, in such a TFT, the gate electrode is made of a conductive material having a light blocking property, and the gate electrode is provided to fill in a groove formed along the semiconductor layer, thereby blocking light coming in a tilted direction from entering the semiconductor layer. Also, JP-A-2007-142320 discloses a technique in which a first layer of the gate electrode functioning as a mask when the semiconductor layer is formed in a self-aligning manner, and a second layer which is formed to be wider than the first layer in order to prevent light from a light source from entering the semiconductor layer, are formed, and thereby the TFT can be formed in the self-aligning manner and the light blocking property of the TFT can be improved.

However, the TFTs disclosed in JP-A-2008-77030 and JP-A-2007-142320 require an annealing process for activating the impurities implanted into the semiconductor layer after forming the gate electrode functioning as a light blocking film, during the manufacturing process. The gate electrode is made of a light blocking material with a relatively high OD (optical density) value such as, for example, titanium nitride (TiN), tungsten silicide (WSi), but if these materials are exposed to high temperature due to the annealing process, the OD value is lowered, and the light blocking property is deteriorated. For this reason, the TFTs disclosed in JP-A-2008-77030 and JP-A-2007-142320 have technical problems in that, due to the manufacturing process and the structural characteristics, the light blocking property of the gate electrode functioning as a light blocking film is reduced due to the annealing process, and thus it is difficult to sufficiently decrease the light leakage current.

SUMMARY

An advantage of some aspect of the invention is to provide an electric optical device, and a manufacturing method thereof, and an electronic device, capable of suppressing a light leakage current by improving the light blocking property in a transistor which can be formed in a self-aligning manner.

According to an aspect of the invention, there is provided an electric optical device including a data line and a scan line intersecting each other; a pixel electrode provided in a pixel corresponding to an intersection of the data line and the scan line; a transistor including (i) a semiconductor layer having a first source/drain region electrically connected to the data line, a second source/drain region electrically connected to the pixel electrode, and a channel region provided between the first source/drain region and the second source/drain region, and (ii) a gate electrode disposed so as to be opposed to the channel region via a gate insulating film; an upper side light blocking film that is formed to have a part overlapping with the gate electrode further to the upper layer side than the gate electrode via an upper side insulating film and is electrically connected to the gate electrode via a first contact hole which is opened in the upper insulating film; and a lower side light blocking film that is formed further to the lower layer side than the semiconductor layer via a lower side insulating film and is electrically connected to the upper side light blocking film via a second contact hole which is opened to penetrate the upper side insulating film, the gate insulating film, and the lower side insulating film.

According to the electric optical device in an aspect of the invention, for example, an image signal is controlled from the data line to the pixel electrode, and thus image display is possible in a so-called active matrix type. The image signal is supplied from the data line to the pixel electrode via the transistor at a predetermined time by the transistor electrically connected between the data line and the pixel electrode being turned on or off. The pixel electrode is a transparent electrode made of a transparent conductive material such as, for example, ITO (indium tin oxide), and is provided in plurality, for example, in a matrix, at a region forming a display region on a substrate, corresponding to the intersection of the data line and the scan line which intersect each other on the substrate.

The transistor has the semiconductor layer and the gate electrode. The semiconductor layer includes the first source/drain region, the second source/drain region, and the channel region. The first source/drain region is electrically connected to the data line, and the second source/drain region is electrically connected to the pixel electrode. The transistor outputs the image signal which is supplied to the first source/drain region from the data line to the pixel electrode electrically connected to the second source/drain region, according to the switching-on and off operations.

The gate electrode is disposed so as to be opposed to the channel region via the gate insulating film. The gate electrode is formed to overlap with the channel region, for example; in a plan view on the substrate. For this reason, when the electric optical device according to an aspect of the invention is manufactured, the gate electrode is used as a mask when impurities are implanted into the semiconductor layer by an ion implantation method.

The upper side light blocking film according to an aspect of the invention is formed further to the upper layer side than the gate electrode via the upper side insulating film. Thereby, light from a light source which comes from the upper side can be blocked from entering the semiconductor layer, and a light leakage current is suppressed from being generated in the semiconductor layer. In an aspect of the invention, particularly, the upper side light blocking film is formed to have a part overlapping with the gate electrode in a plan view on the substrate, and thus it is possible to more efficiently suppress the generation of the light leakage current.

The upper side light blocking film is electrically connected to the gate electrode via the first contact hole which is opened in the upper side insulating film which is provided between the upper side light blocking film and the gate electrode. For this reason, the upper side light blocking film is applied with the same voltage as the gate electrode, and, that is, the upper side light blocking film functions as a portion of the gate electrode.

The lower side light blocking film according to an aspect of the invention is formed further to the lower layer side than the semiconductor layer via the lower side light blocking film. For this reason, light from a light source which comes from the lower side can be blocked from entering the semiconductor layer, and a light leakage current is suppressed from being generated in the semiconductor layer.

The lower side light blocking film is electrically connected to the upper side light blocking film via the second contact hole. The second contact hole which is opened so as to penetrate the upper side insulating film, the gate electrode, and the lower side insulating film, and the upper side light blocking film makes an electric connection between the gate electrode and the lower side light blocking film as a relay layer, due to the upper side light blocking film formed along the inner walls of the second contact hole.

Here, since the upper side light blocking film is formed along the inner walls of the second contact hole, light from a light source which comes from the lateral side can be blocked from entering the semiconductor layer. In other words, of the upper side light blocking film, the part which is provided in the second contact hole functions as a wall-shaped light blocking body, thus can block incident light which is obliquely incident from entering the semiconductor layer, and it is possible to further block the light from entering the semiconductor layer.

In the electric optical device according to an aspect of the invention which has such a laminated structure on the substrate, during the manufacturing thereof, when the transistor is formed, the upper side light blocking film can be formed after the completion of the annealing process for activating the impurities which has been implanted into the semiconductor layer. Thereby, the upper side light blocking film is not exposed to high temperatures during the manufacturing, and the OD value thereof is not lowered. As a result, the upper side light blocking film having a good light blocking property is provided, and thus it is possible to efficiently suppress the light leakage current from being generated in the semiconductor layer. In addition, a manufacturing method of the electric optical device according to an aspect of the invention will be described later.

As described above, according to an aspect of the invention, it is possible to implement the electric optical device provided with the transistor which can be formed in a self-aligning manner and has a good light blocking performance.

In the electric optical device, the gate electrode and the upper side light blocking film may include the same material.

In the electric optical device, the upper side light blocking film electrically connected to the gate electrode may be made of the same material as the gate electrode. Thereby, a periphery of an attached portion between the gate electrode and the upper side light blocking film can be appropriately formed, and a contact resistance in the attached portion can be suppressed.

In the electric optical device, the semiconductor layer may include a junction region formed between the second source/drain region and the channel region, and the upper side light blocking film may be formed to surround the junction region.

In the electric optical device, the semiconductor layer may include a junction region. The junction region means a PN junction region, specifically, for example, when the transistor is formed as a PNP transistor or an NPN transistor (that is, an N channel transistor or a P channel transistor). Alternatively, the junction region means an LDD region when the transistor has an LDD structure (that is, an impurity region which is formed in the semiconductor layer through an impurity implantation by an ion implantation method).

If the junction region is irradiated with light, a light leakage current may be generated in the transistor. Therefore, as described above, the upper side light blocking film is formed to surround the junction region, and thereby it is possible to enhance the light blocking for the semiconductor layer and to efficiently suppress the generation of the light leakage current.

In addition, a junction region may be formed between the first source/drain region and the channel region. In this case, as compared with a case where the junction region formed between the first source/drain region and the channel region is irradiated with light, the light leakage current may be easily generated in the transistor in a case where the junction region formed between the second source/drain region and the channel region is irradiated with light. Therefore, as described above, the upper side light blocking film is formed to focus on and surround the junction area formed between the second source/drain region and the channel region, and thus it is possible to efficiently suppress the leakage current and to prevent reduction in an aperture ratio more than is necessary.

In the electric optical device, the second contact hole may be formed along the semiconductor layer from a flank of a part where the upper light blocking film overlaps with the channel region in a plan view.

In the electric optical device, typically, the gate electrode is formed on a substrate along the semiconductor layer from a flank of a part overlapping with the channel region of the semiconductor layer in a plan view or in a three-dimensional view (hereinafter, a portion protruding along the elongated direction of the semiconductor layer is appropriately referred to as a "protruding portion.").

Here, "the flank overlapping with the channel region" may mean both flanks, that is, a pair of protruding portions may protrude from both flanks of the semiconductor layer which extends in the elongate shape. Alternatively, "the flank overlapping with the channel region" may mean one flank. In addition, "the flank overlapping with the channel region" has some distance from the channel region in the direction perpendicular to the elongated direction of the semiconductor layer and means that the protruding portion protrudes from the semiconductor layer with some distance in its origin side.

In addition, the protruding portion may protrude from one flank or both flanks of the semiconductor layer towards the source region, or may protrude from one flank or both flanks of the semiconductor layer towards the drain region. The protruding portion may protrude towards both the source region and the drain region. In other words, the protruding portions may protrude from the four flanks of a single semiconductor layer up to a maximum of four.

In the electric optical device, the upper side light blocking film may have an OD value of two or more.

In the electric optical device, during the manufacturing thereof, when the transistor is formed, the upper side light blocking film can be formed after the completion of the annealing process for activating impurities implanted into the semiconductor layer. Therefore, the upper side light blocking film is formed without an affect by the annealing process performed for the semiconductor layer, and thus has a good light blocking property with an OD value of two or more.

In the electric optical device, the first contact hole may be integrally formed with the second contact hole.

In the electric optical device, there is no gap between the first contact hole and the second contact hole. Therefore, the upper side light blocking film formed so as to fill in the first contact hole and the second contact hole integrally functions as a wall-shaped light blocking film for the semiconductor layer and can further improve the light blocking performance.

According to an aspect of the invention, there is provided a manufacturing method of an electric optical device including a data line and a scan line intersecting each other on a substrate, a pixel electrode provided in a pixel corresponding to an intersection of the data line and the scan line, and a transistor including (i) a semiconductor layer having a first source/drain region electrically connected to the data line, a second source/drain region electrically connected to the pixel electrode, and a channel region provided between the first source/drain region and the second source/drain region, and (ii) a gate electrode disposed so as to be opposed to the channel region via a gate insulating film, the method including a first step of forming a lower side light blocking film on the substrate; a second step of forming a lower side insulating film on the lower side light blocking film; a third step of forming the semiconductor layer, the gate insulating film, and the gate electrode on the lower side insulating film, a fourth step of implanting an impurity into the semiconductor layer using the gate electrode as a mask and activating the implanted impurity through an annealing process; a fifth step of forming an upper side insulating film on the gate electrode and forming a first contact hole in the upper side insulating film; a sixth step of forming a second contact hole so as to penetrate the lower side insulating film, the gate insulating film, and the upper side insulating film; and a seventh step of forming an upper side light blocking film such that the upper side light blocking film is electrically connected to the gate electrode via the first contact hole and the second contact hole, in a plan view on the substrate.

According to the invention, it is possible to appropriately manufacture the above-described electric optical device (including the various aspects).

In the invention, particularly, the annealing process is performed in the fourth step before the fifth step of forming the upper side light blocking film on the substrate. Therefore, the upper side light blocking film is not exposed to high temperatures due to the annealing process. Specifically, in the related art, due to the structural limit thereof, since the upper side light blocking film is required to be formed before the annealing process, the upper side light blocking film is exposed to high temperatures due to the annealing process, and thus it is difficult to obtain a sufficient light blocking property. In contrast, in the invention, since the annealing process is completed before the upper side light blocking film is formed, it is possible to manufacture the electric optical device including the upper side light blocking film having a sufficient light blocking property (typically, having a high OD value of two or more).

In addition, in the sixth step, the upper side light blocking film may be made of the same material as the gate electrode. Further, the first contact hole and the second contact hole may be formed together. The first contact hole and the second contact hole may be integrally formed with each other.

An electronic device in an aspect of the invention includes the electric optical device according to an aspect of the invention, and thus it is possible to implement various kinds of electronic devices capable of displaying high quality images such as a projection type display device, a television set, a portable telephone, an electronic diary, a portable audio player, a word processor, a digital camera, a view finder type or a monitor direct view type video tape recorder, a workstation, a video phone, a POS terminal, a device including a touch panel, and the like.

Operations and other advantages of the invention will be apparent from the embodiments described below.

BRIEF DESCRIPTION OF THE DRAWINGS

The invention will be described with reference to the accompanying drawings, wherein like numbers reference like elements.

FIG. 8 is a plan view illustrating a configuration of a projector which is an example of an electronic device to which the electric optical device is applied.

DESCRIPTION OF EXEMPLARY EMBODIMENTS

Each example of the electric optical device, a manufacturing method thereof, and an electronic device according to an embodiment of the invention will be described with reference to the accompanying drawings. In addition, in this embodiment, a TFT active matrix driving type liquid crystal display in which driving circuits are embedded will be described as an example of the electric optical device.

Figure 1:
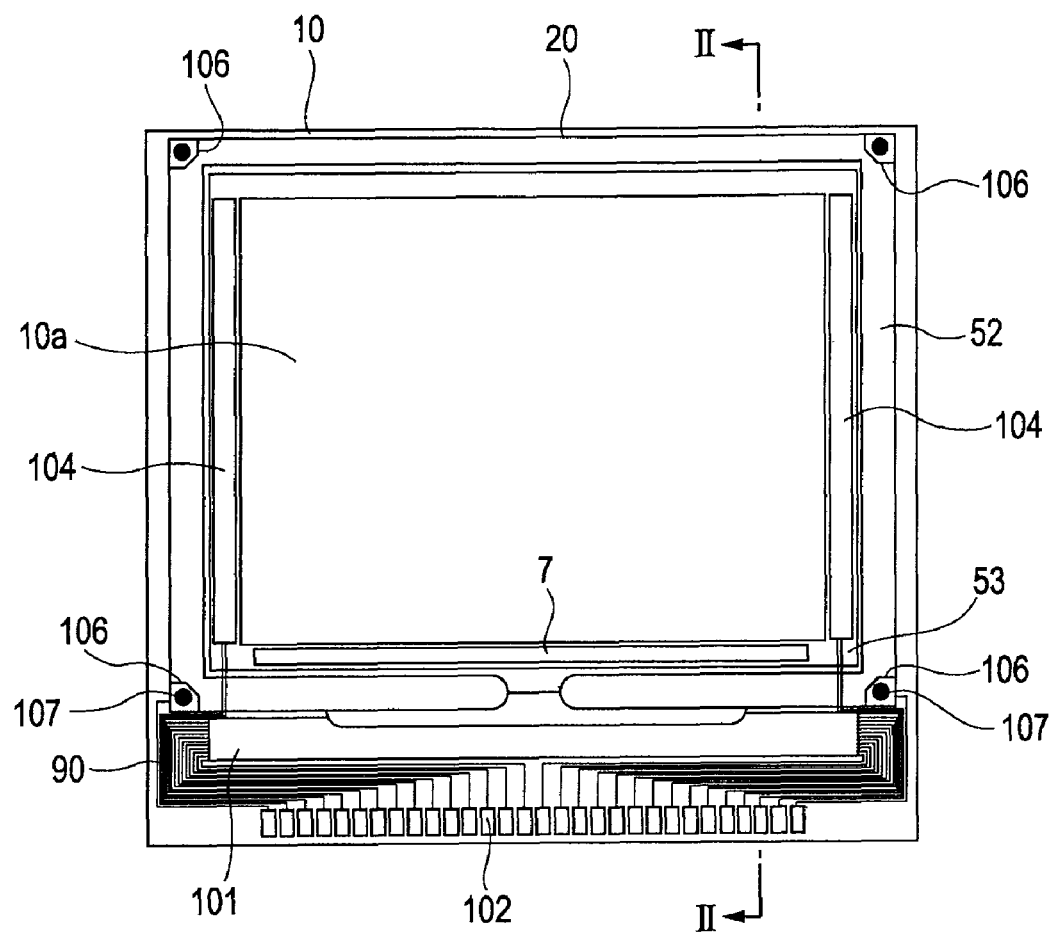
FIG. 1 is a plan view illustrating an entire configuration of a liquid crystal display according to an embodiment of the invention.

First, an entire configuration of the liquid crystal display according to this embodiment will be described with reference to FIGS. 1 and 2. FIG. 1 is a plan view illustrating a TFT array substrate along with respective constituent elements provided thereon when seen from an opposite substrate side, and FIG. 2 is a cross-sectional view taken along the line II-II in FIG. 1.

Figure 2:
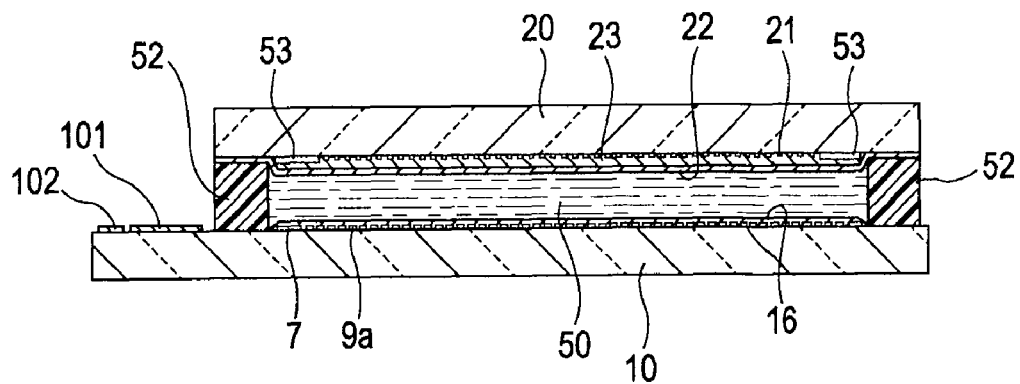
FIG. 2 is a cross-sectional view taken along the line II-II in FIG. 1.

In FIGS. 1 and 2, in the liquid crystal display according to this embodiment, a TFT array substrate 10 and an opposite substrate 20 are disposed opposite to each other. The TFT array substrate 10 is formed of a transparent substrate such as, for example, a quartz substrate, a glass substrate, or a silicon substrate, and the opposite substrate 20 is formed of a transparent substrate such as, for example, a quartz substrate or a glass substrate. A liquid crystal layer 50 is interposed between the TFT array substrate 10 and the opposite substrate 20. The TFT array substrate 10 and the opposite substrate 20 are attached to each other by a sealing member 52 provided in a sealing region which is positioned in the periphery of an image display region 10a corresponding to a region in which a plurality of pixels 100c are provided.

The sealing member 52 is made of, for example, a UV curing resin, or a thermoset resin, or UV curing and thermoset resin, or the like, in order to attach both the substrates together, and is applied on the TFT array substrate 10 in the manufacturing step, and then is cured by UV irradiation, heating, or the like. In the sealing member 52, gap materials such as glass fibers or glass beads for maintaining the gap between the TFT array substrate 10 and the opposite substrate 20 to be a predetermined value are dispersed. Also, the gap materials may be mixed with or added to the sealing member 52, or may replace the sealing member 52, and then may be disposed in the image display region 10a or in the peripheral region around the image display region 10a.

In FIG. 1, a frame light blocking film 53 which has a light blocking property and defines a frame region of the image display region 10a is provided on the opposite substrate 20 side along the inside of the sealing region in which the sealing member 52 is disposed. However, a portion or the entirety of the frame light blocking film 53 may be provided as a light blocking film embedded in the TFT array substrate 10 side.

Of the periphery region, in a region positioned outside the sealing region where the sealing member 52 is disposed of the peripheral region, data line driving circuits 101 and external circuit connection terminals 102 are provided along one side of the TFT array substrate 10. A sampling circuit 7 is provided in the inner side than the sealing region along the one side so as to be covered by the frame light blocking film 53. Scan line driving circuits 104 are provided inside the sealing region along two sides adjacent the one side so as to be covered by the frame light blocking film 53.

On the TFT array substrate 10, upper and lower connecting terminals 106 are provided regions facing four corners of the opposite substrate 20 so as to make a connection between both the substrates using upper and lower connecting materials 107. Thereby, the TFT array substrate 10 can be electrically connected to the opposite substrate 20. In addition, drawing wires 90 are formed to make an electric connection between the external circuit connection terminals 102, the data line driving circuits 101, the scan line driving circuits 104, the upper and lower connecting terminals 106, and the like.

In FIG. 2, a laminated structure including TFTs which are used to switch pixels, and wires such as scan lines, data lines, and the like is formed on the TFT array substrate 10. Although a detailed configuration of the laminated structure is omitted in FIG. 2, a pixel electrode 9a, made of a transparent material such as ITO, is formed in an island shape with a predetermined pattern for each pixel, on the laminated structure.

The pixel electrode 9a is formed in the image display region 10a on the TFT array substrate 10 so as to be opposed to an opposite electrode 21 described later. An alignment layer 16 is formed on a surface in the TFT array substrate 10 coming into contact with the liquid crystal layer 50, that is, on the pixel electrodes 9a so as to cover the pixel electrodes 9a.

A light blocking film 23 is formed on an opposite surface to the TFT array substrate 10 in the opposite substrate 20. The light blocking film 23 is formed in a reticular pattern, for example, when seen from the opposite surface in the opposite substrate 20, that is, in a plan view. In the opposite substrate 20, non-aperture regions are defined by the light blocking film 23, and regions partitioned by the light blocking film 23 form aperture regions through which light emitted from, for example, lamps for a projector or backlight for direct views. In addition, the light blocking film 23 may be formed in a stripe shape, and the non-aperture regions may be defined by various kinds of constituent elements such as the light blocking film 23 and the data lines provided on the TFT array substrate 10 side.

Opposite electrodes 21 made of a transparent material such as ITO are formed to be opposed to the plurality of pixel electrodes 9a on the light blocking film 23. On the light blocking film 23, color filters (not shown in FIG. 2) may be formed in the aperture regions and regions including a portion of the non-aperture regions, for color display in the image display region 10a. An alignment layer 22 is formed on the opposite electrodes 21 in the opposite surface of the opposite substrate 20.

Further, on the TFT array substrate 10 shown in FIGS. 1 and 2, in addition to the data line driving circuits 101, the scan line driving circuits 104, the sampling circuit 7, and the like, a pre-charge circuit which supplies a pre-charge signal with a predetermined voltage level to the plurality of data lines 6a preceding the image signal, an inspection circuit used to inspect quality, defects, and the like of the corresponding liquid crystal display whilst manufacturing the liquid crystal display or at the time of the shipment thereof, may be formed.

Next, an electric configuration of the pixel portion of the liquid crystal display according to this embodiment will be described with reference to FIG. 3. Here, FIG. 3 shows an equivalent circuit diagram of various kinds of elements and wires in the plurality of pixels which forms the image display region of the liquid crystal display and are formed in a matrix.

Figure 3:
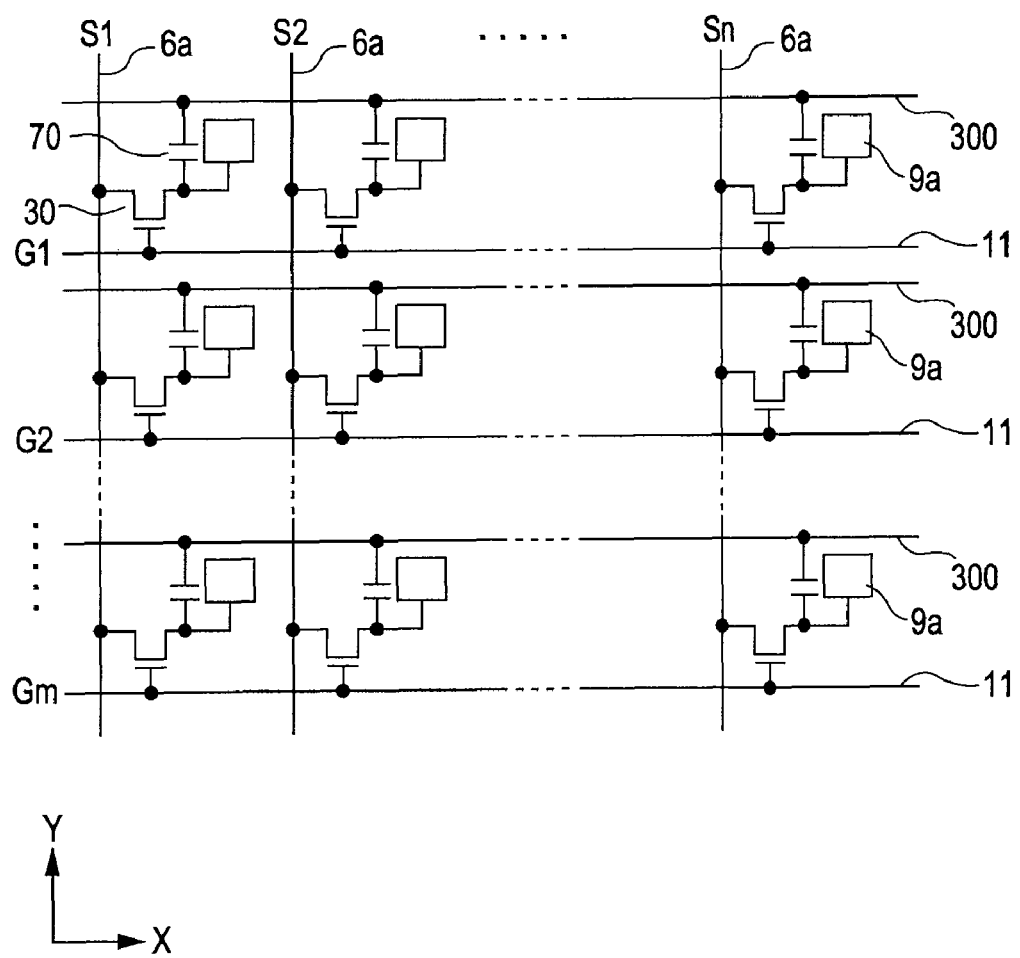
FIG. 3 is an equivalent circuit diagram of plural pixel portions of the liquid crystal display according to an embodiment of the invention.

In FIG. 3, the pixel electrode 9a, and the TFT 30, which is an example of a "transistor" according to an embodiment of the invention, are formed for each of the pixels forming the image display region 10A and formed in the matrix. The TFT 30 is electrically connected to the pixel electrode 9a and controls the switching of the pixel electrode 9a during operation of the liquid crystal display. The data line 6a supplied with an image signal is electrically connected to a source terminal of the TFT 30. The image signals S1, S2, . . . , and Sn written in the data lines 6a may be sequentially supplied one by one, or may be supplied for each group including adjacent data lines 6a.

Also, the scan lines 11 are electrically connected to gate terminals of the TFTs 30, and, in the liquid crystal display, scan signals G1, G2, . . . , and Gm are sequentially applied to the scan lines 11 one by one in a pulse form at predetermined timings. The pixel electrodes 9a are electrically connected to drain terminals of the TFTs 30, and the TFTs 30, which are switching elements, are turned on during constant periods, and thus the image signals S1, S2, . . . , and Sn supplied from the data lines 6a are written in the pixel electrodes 9a at predetermined timings. The image signals S1, S2, . . . , and Sn with predetermined levels written in the liquid crystal, which is an example of an electric optical material, via the pixel electrodes 9a are stored between the liquid crystal and the opposite electrodes formed on the opposite substrate over a fixed period.

The liquid crystal forming the liquid crystal layer 50 (refer to FIG. 2) alters alignment or order of molecular sets due to applied voltage levels, and thereby light can be modulated and a grayscale display can be performed. If the liquid crystal is in a normally white mode, the transmittance of incident light decreases, and if the liquid crystal is in a normally black mode, the transmittance of incident light increases according to a voltage applied to each pixel. Therefore, light having the contrast corresponding to the image signals is emitted from the entire liquid crystal display.

Here, in order to prevent the stored image signals from being leaked, an accumulation capacitor 70 is formed in parallel to a liquid crystal capacitor formed between the pixel electrode 9a and the opposite electrode 21 (refer to FIG. 2). The accumulation capacitor 70 is a capacitive element functioning as a storage capacitor which temporarily maintains a potential at each pixel electrode 9a according to the supply of the image signals. One electrode of the accumulation capacitor 70 is connected to the drain terminal of the TFT 30 in parallel to the pixel electrode 9a, and the other electrode thereof is connected to a capacitance line 300 so as to have a constant value. Due to the accumulation capacitor 70, the voltage maintaining characteristic in the pixel electrode 9a can be improved, and the display characteristics such as improvement in contrast or reduction in flickering can be improved. In addition, the accumulation capacitor 70 functions as an internal light blocking film which blocks light from entering the TFT 30 as described later.

Figure 4:
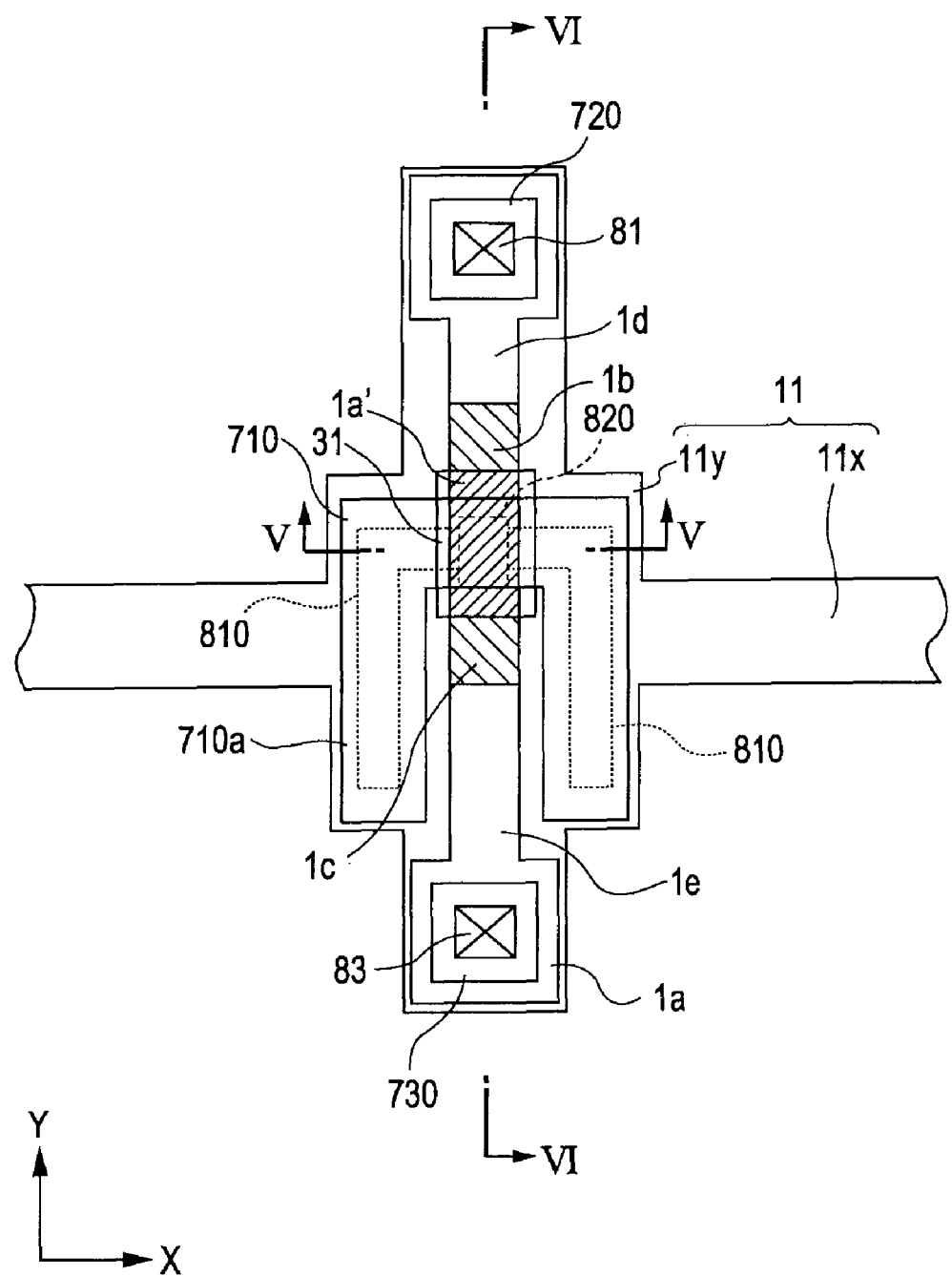
FIG. 4 is a plan view illustrating a gate electrode of the liquid crystal display according to an embodiment of the invention.
Figure 5:
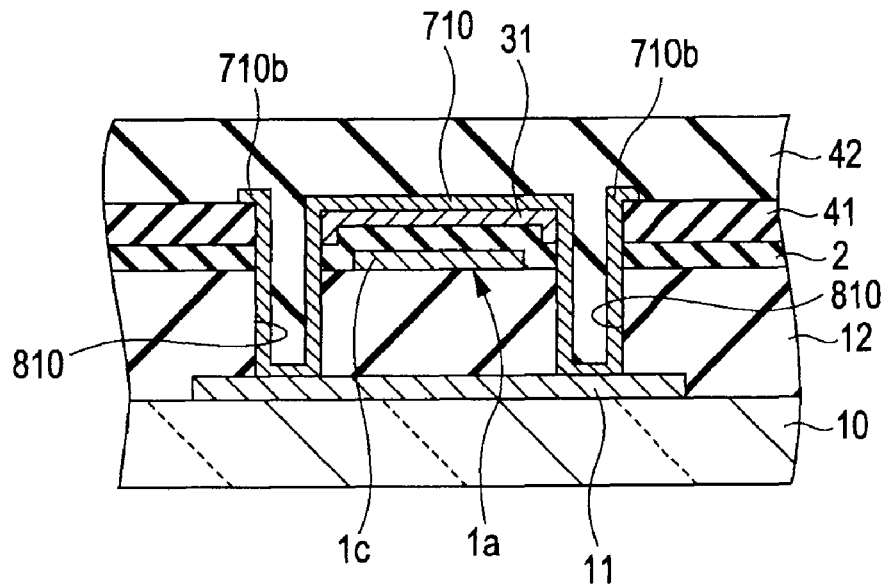
FIG. 5 is a cross-sectional view taken along the line V-V in FIG. 4.

Next, the shape of the gate electrode of the liquid crystal display according to this embodiment will be described with reference to FIGS. 4 to 6. Here, FIG. 4 is a plan view illustrating a planar shape of the gate electrode of the liquid crystal display according to this embodiment. FIG. 5 is a cross-sectional view taken along the line V-V in FIG. 4, and FIG. 6 is a cross-sectional view taken along the line VI-VI in FIG. 4.

Figure 6:
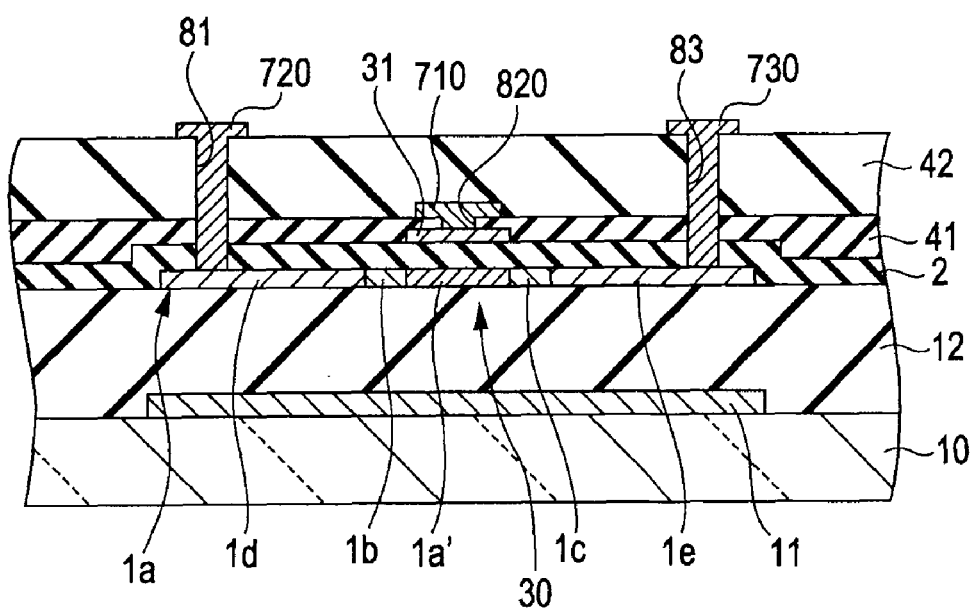
FIG. 6 is a cross-sectional view taken along the line VI-VI in FIG. 4.

In addition, in FIGS. 4 to 6, for better recognition of respective layers and members, the respective layers and members are different from each other in scale in the figures. Further, in FIGS. 4 to 6, for convenience of description, constituent elements positioned on the conductive light blocking film 710 are not shown in the figures.

In FIG. 4, the scan line 11 extends in the X direction, and the data line 6a (not shown) extends in the Y direction so as to intersect the scan line 11. The TFT 30 for pixel switching is provided at the intersection of the scan line 11 and the data line 6a.

The scan line 11, the data line 6a, the conductive light blocking film 710, and the TFT 30 are disposed in the non-aperture regions which surround the aperture region (that is, a region through or from which light actually contributing to the display in each pixel is transmitted or reflected) of each pixel corresponding to the pixel electrode 9a (not shown) in a plan view on the TFT array substrate 10. In other words, the scan line 11, the data line 6a, the conductive light blocking film 710, and the TFT 30 are disposed in the non-aperture regions so as not to hinder the display.

In FIGS. 4 and 6, the TFT 30 includes a semiconductor layer 1a and a gate electrode 31.

The semiconductor layer 1a is made of, for example, polysilicon, and includes a channel region 1a' having a channel length in the Y direction, a data line side LDD region 1b, a pixel electrode side LDD region 1c, a data line side source/drain region 1d, and a pixel electrode side source/drain region 1e. That is to say, the TFT 30 has an LDD structure. Here, the data line side source/drain region 1b is an example of a "first source/drain electrode" according to an embodiment of the invention, and the pixel electrode side source/drain region 1e is an example of a "second source/drain region" according to an embodiment of the invention. In addition, the pixel electrode side LDD region 1c is an example of a "junction region" according to an embodiment of the invention.

The data line side source/drain region 1d and the pixel electrode side source/drain region 1e are nearly mirror-symmetrical with respect to the channel region 1a' in the Y direction. The data line side LDD region 1b is formed between the channel region 1a' and the data line side source/drain region 1d. The pixel electrode side LDD region 1c is formed between the channel region 1a' and the pixel electrode side source/drain region 1e.

The data line side LDD region 1b and the pixel electrode side LDD region 1c are respectively formed by impurity regions having a lower concentration of impurities than the data line side source/drain region 1d and the pixel electrode side source/drain region 1e. Due to the impurity regions, it is possible to reduce an off current flowing through the source/drain regions during non-operation of the TFT 30 and suppress the reduction in an on current flowing during operation of the TFT 30. In this embodiment, particularly, the TFT 30 is a self-aligning transistor formed by implanting impurities with high concentration by an ion implantation method using the gate electrode 31 as a mask.

As shown in FIGS. 5 and 6, the gate electrode 31 is disposed over the semiconductor layer 1a, and is made of, for example, a light blocking conductive material with a relatively high OD value such as, titanium nitride (TiN) or tungsten silicide (WSi). The gate electrode 31 functions as a mask when impurities are implanted into the semiconductor layer 1a, and thus the length thereof corresponds with the length of the channel region 1a' in the Y direction as shown in FIG. 4. In addition, an insulating film 2 (refer to FIGS. 5 and 6) which is an example of a "gate insulating film" according to an embodiment of the invention makes an insulation between the gate electrode 31 and the semiconductor layer 1a.

As shown in FIGS. 5 and 6, the conductive light blocking film 710 is disposed on the upper layer side via an interlayer insulating film 41 (refer to FIG. 6) which is an example of an "upper side insulating film" according to an embodiment of the invention when seen from the TFT 30 on the TFT array substrate 10, and is made of the same material as the gate electrode 31, for example, a light blocking conductive material with a relatively high OD value such as, titanium nitride (TiN) or tungsten silicide (WSi).

As shown in FIG. 4, the conductive light blocking film 710 has an extending portion 710a which is provided extending along both sides of the pixel electrode side LDD region 1c. In other words, the conductive light blocking film 710 has a shape which overlaps with the gate electrode 31 and partially surrounds both sides of the pixel electrode side LDD region 1c (that is, a reverse U shape). In addition, the conductive light blocking film 710 is an example of an "upper side light blocking film" according to an embodiment of the invention. Further, as shown in FIGS. 4 and 5, a groove 810 which is an example of a "second contact hole" according to an embodiment of the invention is formed in an insulating film 2 and a bottom insulating film 12.

As shown in FIG. 6, the conductive light blocking film 710 is electrically connected to the gate electrode 31 via a contact hole 820 formed in the interlayer insulating film 41. Thereby, the conductive light blocking film 710 is applied with the same potential as the gate electrode 31. In addition, the contact hole 820 is an example of a "first contact hole" according to an embodiment of the invention.

As shown in FIG. 4, in this embodiment, the groove portion 810 and the contact hole 820 are integrally formed with each other, and thus there is no gap between the groove portion 810 and the contact hole 820. Therefore, the conductive light blocking film 710, which is formed to fill in the groove portion 810 and the contact hole 820, integrally functions as a wall-shaped light blocking film for the semiconductor layer 1a, and thus can further improve the light blocking performance.

The bottom insulating film 12 is an example of a "lower side insulating film" according to an embodiment of the invention. In addition to the function of insulating the TFT 30 from the scan line 11, the bottom insulating film 12 is formed on the entire surface of the TFT array substrate 10, and thus has a function of preventing the roughness during the polishing of the surface of the TFT array substrate 10 or preventing deterioration in the characteristics of the TFT 30 for the pixel switching due to pollutants remaining after the cleaning.

The groove portion 810 reaches the scan line 11 by penetrating the insulating film 2 and the bottom insulating film 12, and the conductive light blocking film 710 formed in the groove portion 810 is electrically connected to the scan line 11. Thereby, the conductive light blocking film 710 formed in the groove portion 810 is formed as a wall-shaped light blocking body along the pixel electrode side LDD region 1c of the semiconductor layer 1a in a three-dimensional view.

Therefore, incident light (that is, incident light having components traveling in the X direction or the Y direction in FIG. 4) which is obliquely incident to the pixel electrode side LDD region 1c can be blocked by the conductive light blocking film 710 formed in the groove portion 810. In other words, due to the conductive light blocking film 710 formed in the groove portion 810 as the wall-shaped light blocking body disposed around the pixel electrode side LDD region 1c, it is possible to enhance light blocking performance regarding the incident light which is obliquely incident to the pixel electrode side LDD region 1c. As a result, it is possible to suppress the light leakage current in the semiconductor layer 1a and to reduce flickering or pixel unevenness during the image display.

On the other hand, the groove portion 810 may be formed in one side of the pixel electrode side LDD region 1c (the left side or the right side in FIG. 5), and the conductive light blocking film 710 may be formed only in one side of the pixel electrode side LDD region 1c. In this case as well, it is possible to enhance the light blocking performance for the incident light which is obliquely incident to the pixel electrode side LDD region 1c, accordingly. However, from the viewpoint of enhancing the light blocking performance, the conductive light blocking film 710 is preferably formed in both sides of the pixel electrode side LDD region 1c as in this embodiment.

As shown in FIGS. 5 and 6, the scan line 11 is disposed under the semiconductor layer 1a via the bottom insulating film 12, and, is made of, for example, a light blocking conductive material such as high-melting metal materials including tungsten (W), titanium (Ti), and titanium nitride (TiN). The scan line 11 includes a main line portion 11x which is patterned in a stripe shape in the X direction and an extending portion 11y which extends from the main line portion 11x in the Y direction, in a plan view on the TFT array substrate 10.

As shown in FIG. 4, the scan line 11 includes regions opposite to the channel region 1a', the data line side LDD region 1b, the pixel electrode side LDD region 1c, the data line side source/drain region 1d, and the pixel electrode side source/drain region 1e, of the TFT 30. Therefore, the scan line 11 can completely or nearly completely block returning light such as light reflected from the rear surface of the TFT array substrate 10, or light which is generated from other liquid crystal display in a double-plate type projector or the like and passes through a synthesis optical system, from entering the channel region 1a' of the TFT 30. In other words, the scan line 11 functions as a wire supplying the scan signal and can block the returning light from entering the TFT 30. Therefore, the light leakage current in the TFT 30 is reduced during operation of the liquid crystal display, and thus it is possible to increase the contrast ratio and realize high definition image display.

Further, as shown in FIG. 4, the conductive light blocking film 710 surrounds the pixel electrode side LDD region 1c. Thereby, the conductive light blocking film 710, the gate electrode 31, and the scan line 11 can block most of light from entering the pixel electrode side LDD region 1c.

Here, during operation of the TFT 30, the light leakage current may be relatively easily generated in the pixel electrode side LDD region 1c as compared with the data line side LDD region 1b. In other words, during operation of the TFT 30, in a case where light enters the pixel electrode side LDD region 1c, the light leakage current is easily generated in the TFT 30 as compared with a case where light enters the data line side LDD region 1b. Therefore, as described above, due to the formation of the conductive light blocking film 710, it is possible to increase the light blocking performance for the pixel electrode side LDD region 1c in which the light leakage current is relatively easily generated and to efficiently reduce the light leakage current flowing through the TFT 30.

As shown in FIG. 6, on the upper layer side of the conductive light blocking film 710, a relay electrode 720 which is electrically connected to the data line side source/drain region 1d via the contact hole 81 is formed and a relay electrode 730 which is electrically connected to the pixel electrode side source/drain region 1e via the contact hole 83 is formed, via an interlayer insulating film 42.

Due to the formation of the relay electrodes 720 and 730, it is possible to reduce an electric resistance between, for example, the data line 6a or the pixel electrode 9a which is disposed on the upper layer side of the relay electrodes 720 and 730, and the semiconductor layer 1a, or to prevent disconnection of the lines.

As described above, in the liquid crystal display having the laminated structure, during the manufacturing thereof, when the TFT 30 is formed, the conductive light blocking film 710 can be formed after the completion of the annealing process for activating the impurities implanted into the semiconductor layer 1a. For this reason, the conductive light blocking film 710 is not exposed to high temperatures, and the OD value thereof is not lowered. As a result, since the conductive light blocking film 710 having a good light blocking property is provided, it is possible to efficiently suppress the light leakage current from being generated in the semiconductor layer 1a.

Manufacturing Method

With reference to FIGS. 7A to 7F, a manufacturing method of the liquid crystal display according to this embodiment described above will be described. FIGS. 7A to 7F are cross-sectional views illustrating respective steps in a manufacturing method according to a manufacturing order, based on the configurations of the cross-sections shown in FIGS. 5 and 6.

Figure 7A:
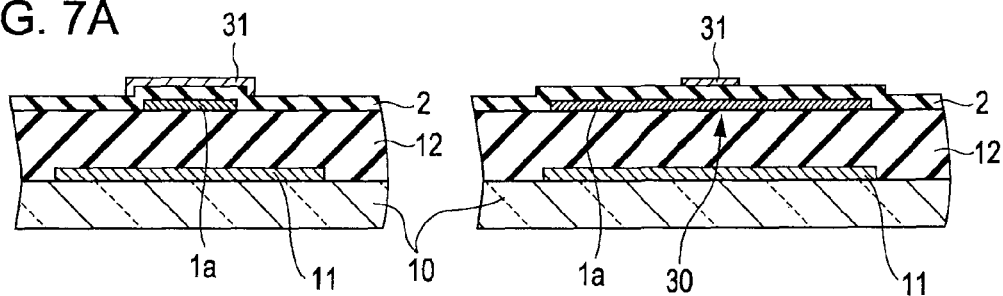
FIGS. 7A to 7F are cross-sectional views illustrating respective steps in a manufacturing method of the liquid crystal display according to the embodiment, according to a manufacturing order, based on the configurations of the cross-sections shown in FIGS. 5 and 6.

In FIG. 7A, a substrate 10 such as, for example, a silicon substrate, a quartz substrate, or a glass substrate is prepared. Here, preferably, a pre-process is performed for the substrate 10 through heat treatment under an inert gas atmosphere of $N_2$ (nitrogen) at a high temperature of about 850 to 1300° C. and more preferably 1000° C. such that distortion occurring in the substrate 10 in a subsequent high-temperature process decreases.

Next, using metal such as, for example, Ti, Cr, W, Ta, Mo, or Pd, or a metal alloy film such as metal silicide, a light blocking layer with the film thickness of about 100 to 500 nm and preferably about 200 nm is formed on the entire surface of the substrate 10 having undergone the process by a sputtering method or the like, and then the scan line 11 having the pattern as shown in FIG. 4 is formed by, for example, a photolithography method and an etching process.

Thereafter, the bottom insulating film 12 made of silicon nitride film, silicon oxide film, or the like is formed on the scan line 11 by, for example, an atmospheric pressure CVD, a low pressure CVD, or the like. In addition, a polysilicon film forming the semiconductor layer 1a is grown in a solid phase on the bottom insulating film 12, and the semiconductor layer 1a having a predetermined pattern shown in FIG. 4 is formed by, for example, a photolithography method and an etching process. The insulating film 2 forming a gate insulating film is formed on the semiconductor layer 1a.

A conductive layer forming the gate electrode 31 made of a light blocking conductive material with a relatively high OD value such as titanium nitride (TiN), tungsten silicide (WSi), or the like is formed on the insulating film 2. The conductive layer is formed as the gate electrode 31 having a predetermined pattern shown in FIG. 4 by, for example, a photolithography method and an etching process.

Figure 7B:
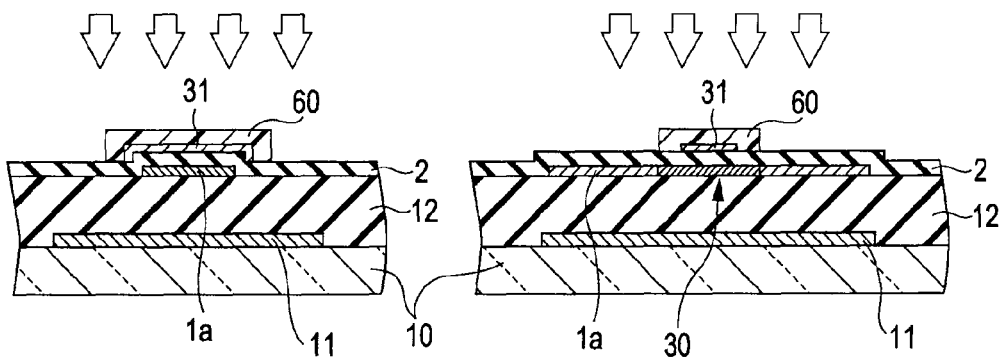

Thereafter, as shown in FIG. 7B, a resist film 60 is formed on the gate electrode 31, and, an impurity is implanted from the upper layer side using the resist film 60 as a mask by, for example, an ion implantation method. In a plan view on the TFT array substrate 10, the impurity is blocked by the resist film 60 in the region overlapping with the resist film 60, and thus a concentration difference in the impurity to be implanted occurs between the regions corresponding to the data line side source/drain region 1d and the pixel electrode side source/drain region 1e and other regions.

Figure 7C:
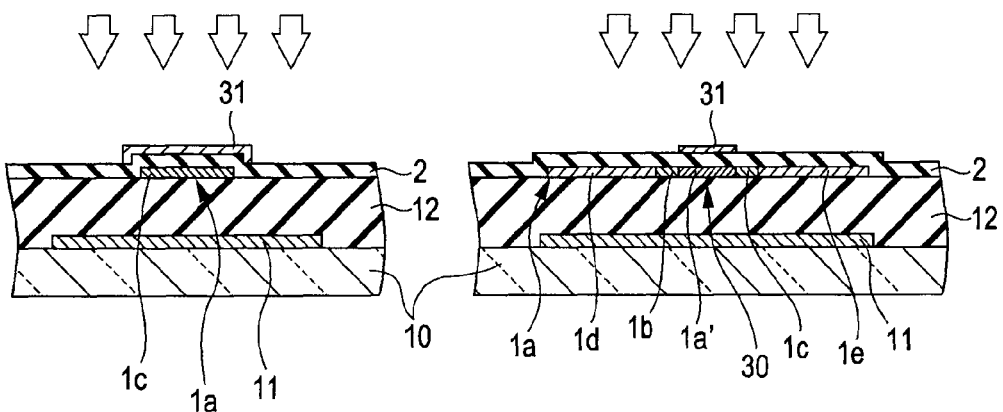

Next, as shown in FIG. 7C, after the resist film 60 is removed, an impurity is implanted from the upper layer side using the gate electrode 31 as a mask by, for example, an ion implantation method, thereby forming the data line side LDD region 1b, the pixel electrode side LDD region 1c, the data line side source/drain region 1d, the pixel electrode side source/drain region 1e, and the channel region 1a' in a self-aligning method.

Thereafter, an annealing process is performed for the semiconductor layer 1a into which the impurity has been implanted, so as to activate the impurity implanted into the semiconductor layer 1a, thereby forming the data line side LDD region 1b, the pixel electrode side LDD region 1c, the data line side source/drain region 1d, the pixel electrode side source/drain region 1e, and the channel region 1a'.

Figure 7D:
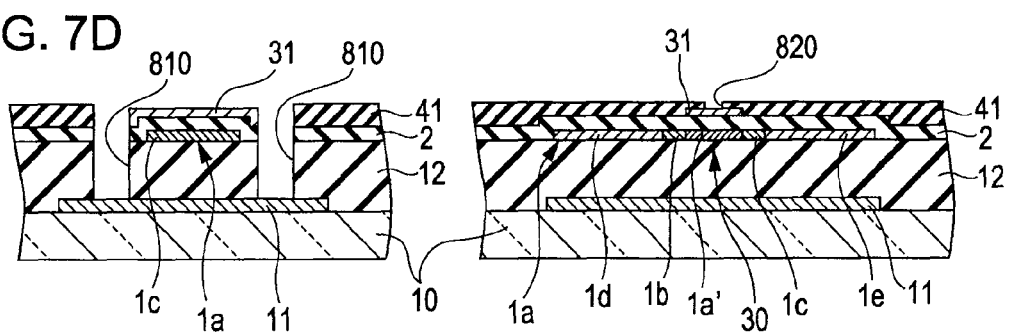

Next, as shown in FIG. 7D, the interlayer insulating film 41 is formed on the TFT 30, and the groove portion 810 and the contact hole 820 are formed by, for example, a photolithography method and an etching process. The groove portion 810 is deeply formed such that the bottom of the groove portion 810 exposes the surface of the scan line 11. In addition, the contact hole 820 is deeply formed such that the bottom of the contact hole 820 exposes the surface of the gate electrode 31.

Figure 7E:
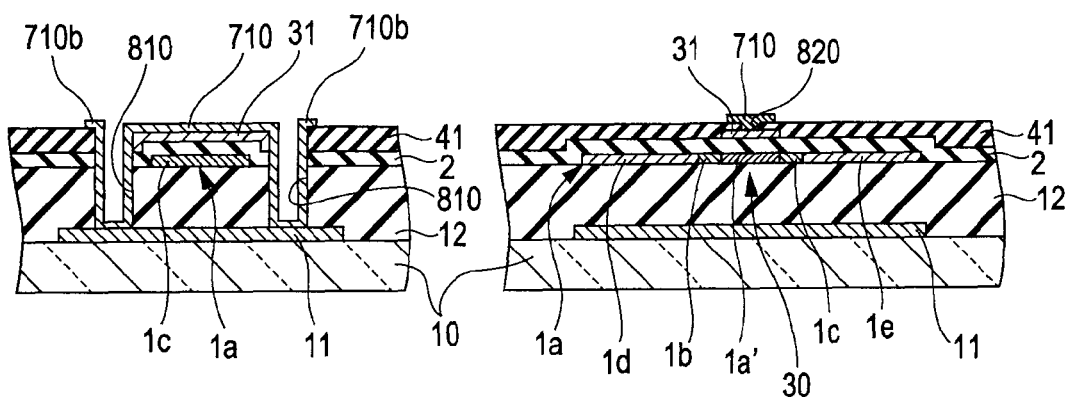

Thereafter, as shown in FIG. 7E, a conductive film forming the conductive light blocking film 710 is formed on the upper layer side so as to fill in the groove portion 810 and the contact hole 820 (that is, so as to cover at least the inner walls). The conductive film is made of a conductive material with a relative high OD value such as, for example, titanium nitride (TiN), or tungsten silicide (WSi). The conductive film is formed as the conductive light blocking film 710 having a predetermined pattern shown in FIGS. 4 to 6 by, for example, a photolithography method and an etching process.

In this way, since the conductive light blocking film 710 is formed after the annealing process performed for the semiconductor layer 1a is finished, it is not exposed to high temperatures. For this reason, the OD value of the light blocking material such as, for example, titanium nitride (TiN) or tungsten silicide (WSi) is not lowered. Therefore, it is possible to form the conductive light blocking film 710 having a good light blocking property and to efficiently suppress the light leakage current from being generated in the semiconductor layer 1a.

Figure 7F:
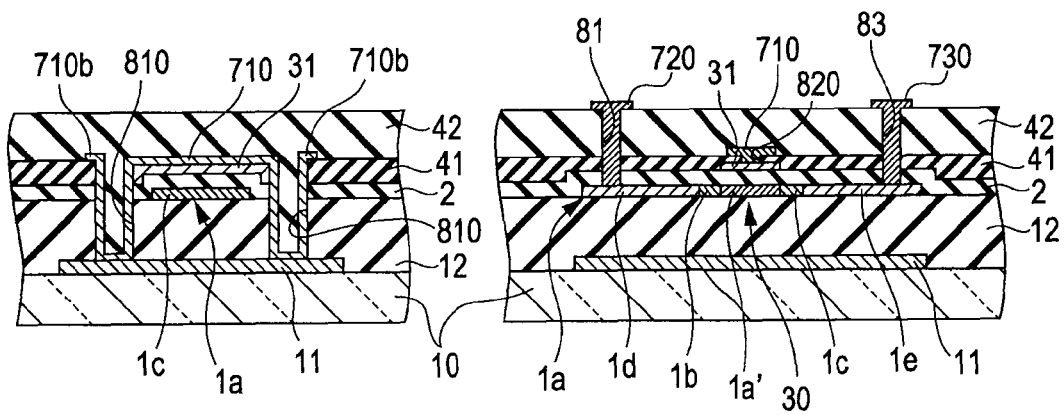

Thereafter, as shown in FIG. 7F, the interlayer insulating film 42 is formed on the conductive light blocking film 710, and the contact holes 81 and 83 are formed in the interlayer insulating film 42. Further, the relay electrodes 720 and 730 are formed so as to fill in the contact holes 81 and 83, thereby completing the liquid crystal display according to this embodiment.

Electronic Device

With reference to FIG. 8, a case of applying the above-described liquid crystal display to a projector which is an example of an electronic device will be described. The liquid crystal display is used as a light valve of the projector. FIG. 8 is a plan view illustrating a configuration example of the projector.

As shown in FIG. 8, a lamp unit 1102 including a white light source such as a halogen lamp is provided inside the projector 1100. Projection light emitted from the lamp unit 1102 is divided into the three primary colors light of RGB by four mirrors 1106 and two dichroic mirrors 1108 which are disposed in a light guide 1104, and then is incident to liquid crystal panels 1110R, 1110B and 1110G which are light values corresponding to the respective primary colors.

A configuration of each of the liquid crystal panels 1110R, 1110B and 1110G is the same as the configuration of the above-described liquid crystal display, and they are driven using primary color signals of R, G and B supplied from an image signal processing circuit. The light modulated by the liquid crystal panels is incident to a dichroic prism 1112 in three directions. In the dichroic prism 1112, the R and B light is refracted by 90 degrees and the G light travels in a straight line. Therefore, as a result of synthesis of images of the respective colors, a color image is projected onto a screen or the like via a projection lens 1114.

In terms of images displayed by the respective liquid crystal panels 1110R, 1110B and 1110G, images displayed by the liquid crystal panels 1110R and 1110B are required to be mirror-reverse to images displayed by the liquid crystal panel 1110G.

In addition, since light beams corresponding to the primary colors R, G and B are incident to the respective liquid crystal panels 1110R, 1110B and 1110G, there is no need for color filters.

In addition to the electronic device described above with reference to FIG. 8, the electronic device includes a mobile type personal computer, a portable telephone, a liquid crystal television set, a view finder type or a monitor direct view type video tape recorder, a car navigation device, a pager, an electronic diary, an electronic calculator, a word processor, a workstation, a video phone, a POS terminal, a device including a touch panel, and the like. The invention is also applicable to these various kinds of electronic devices.

The invention is not limited to the above-described embodiment but may be appropriately modified without departing from or being contrary to the scope and spirit of the invention which are readable from the appended claims and the specification, and thus a substrate for an electric optical device, an electric optical device, and an electronic device are also included in the technical scope of the invention.

The entire disclosure of Japanese Patent Application No. 2010-050233, filed Mar. 8, 2010 is expressly incorporated by reference herein.

What is claimed is:

1. An electric optical device comprising:
    a substrate;
    a data line and a scan line intersecting each other on the substrate;

a pixel electrode provided in a pixel corresponding to an intersection of the data line and the scan line;

a transistor provided between the pixel electrode and the substrate, the transistor including:

a semiconductor layer having a first source/drain region electrically connected to the data line, a second source/drain region electrically connected to the pixel electrode, and a channel region provided between the first source/drain region and the second source/drain region, a gate electrode provided to be opposed to the channel region, and a gate insulating film provided between the channel region and the gate electrode;

a first insulating film provided between the pixel electrode and the gate electrode;

a first light blocking film provided between the first insulating film and the gate electrode, the first light blocking film being formed to have a part overlapping with the gate electrode, and being electrically connected to the gate electrode via a first contact hole which is opened in the first insulating film;

a second insulating film provided between the semiconductor layer and the substrate; and a second light blocking film provided between the second insulating film and the substrate, the second light blocking film being electrically connected to the first light blocking film via a second contact hole which is opened to penetrate the first insulating film, the gate insulating film, and the second insulating film.

2. The electric optical device according to claim 1, wherein the gate electrode and the first light blocking film include the same material.

3. The electric optical device according to claim 1, wherein the semiconductor layer includes a junction region formed between the second source/drain region and the channel region, and wherein the first light blocking film is formed to surround the junction region.

4. The electric optical device according to claim 1, wherein the second contact hole is formed along the semiconductor layer from a flank of a part where the first light blocking film overlaps with the channel region in a plan view.

5. The electric optical device according to claim 1, wherein the first light blocking film has an OD value of two or more.

6. The electric optical device according to claim 1, wherein the first contact hole is integrally formed with the second contact hole.

7. An electronic device comprising the electric optical device according to claim 1.

* * * * *